(12) United States Patent
Alzu et al.

(10) Patent No.: US 6,271,733 B1
(45) Date of Patent: Aug. 7, 2001

(54) INTEGRATED OSCILLATOR CIRCUIT WITH A MEMORY BASED FREQUENCY CONTROL CIRCUIT AND ASSOCIATED METHODS

(75) Inventors: Ignacio Herrera Alzu, Madrid; Rogelio Peon, Gijon, both of (ES); Maarten Visee, Houten (NL); Robert William Walden, Bethlehem, PA (US)

(73) Assignee: Agere Systems Guardian Corp., Murray Hill, NJ (US)

( * ) Notice: Subject to any disclaimer, the term of this patent is extended or adjusted under 35 U.S.C. 154(b) by 0 days.

(21) Appl. No.: 09/460,159

(22) Filed: Dec. 13, 1999

(51) Int. Cl.[7] ....................................... H03B 5/36
(52) U.S. Cl. .................. 331/108 D; 331/158; 331/177 V
(58) Field of Search ............................. 331/36 C, 116 R, 331/116 FE, 158, 176, 177 R, 177 V, 108 D

(56) References Cited

U.S. PATENT DOCUMENTS

| | | | |
|---|---|---|---|
| 4,827,226 | 5/1989 | Connell | 331/116 FE |
| 5,030,926 | 7/1991 | Walden | 331/116 FE |
| 5,117,206 | * 5/1992 | Imamura | 331/158 |
| 5,631,609 | * 5/1997 | Oka et al. | 331/158 |
| 5,648,744 | * 7/1997 | Prakash et al. | 331/36 C |
| 5,777,524 | * 7/1998 | Wojewoda et al. | 331/177 V |
| 6,100,770 | * 8/2000 | Litwin et al. | 331/177 V |

* cited by examiner

Primary Examiner—Siegfried H. Grimm
(74) Attorney, Agent, or Firm—Allen, Dyer, Doppelt, Milbrath & Gilchrist, P.A.

(57) ABSTRACT

An integrated circuit includes an oscillator circuit for generating an output signal having a desired frequency. The oscillator circuit includes a capacitive device having a controllable capacitance value responsive to a control signal. A control circuit is connected to the oscillator circuit for controlling the capacitance value so that the oscillator circuit generates the output signal at the desired frequency. The control circuit includes a memory for storing a digital control word and a control signal generating circuit for converting the digital control word into the control signal for the capacitive device. Setting the desired frequency of the output signal is performed internal to the integrated circuit without requiring complex control circuitry for switching among various capacitors.

23 Claims, 3 Drawing Sheets

INTEGRATED OSCILLATOR CIRCUIT WITH A MEMORY BASED FREQUENCY CONTROL CIRCUIT AND ASSOCIATED METHODS

FIELD OF THE INVENTION

The present invention relates to the field of oscillators, and, more particularly, to an integrated oscillator circuit and associated methods for setting an output frequency.

BACKGROUND OF THE INVENTION

An oscillator circuit generates an output signal at a desired frequency with a specific waveform. Although an oscillator circuit can be used to perform definite functions in different type circuits, such as timing circuits, transmitter/receiver circuits and the like, for example, the desired frequency of the output signal is not typically changed.

There are numerous approaches for an oscillator circuit which uses semiconductor devices, one of which is the Pierce oscillator. The Pierce oscillator includes a crystal, an inverter connected across the crystal, and a respective capacitor connected to a first and second terminal of the external crystal. The inverter provides phase shift and amplification for the oscillating signal. An amplifier is connected either before or after the inverter for providing the output signal which may be used for performing a definite function, such as synchronizing digital logic circuitry. The amplifier has a large gain to accurately detect small changes in the crystal output voltage.

Unfortunately, manufacturing process variations in a metal oxide semiconductor (MOS) integrated oscillator circuit causes frequency dispersion in the output signal. For example, transistor and capacitor process variations cause the desired frequency of the output signal from the integrated oscillator circuit to vary. In addition, frequency dispersion of the integrated oscillator circuit can also be caused by temperature and voltage variations, and aging of the components. Frequency dispersion can be minimized to a certain point in the design of the integrated oscillator circuit. However, some applications require a very small dispersion, such as within 25 part per million (ppm). Consequently, the frequency of the output signal needs to be set or trimmed to the desired frequency.

One approach to setting the frequency of the output signal is to include capacitors having variable capacitance within the integrated oscillator circuit. By including two or more variable capacitors, they can be selectively connected for setting the frequency of the output signal to the desired frequency. For example, U.S. Pat. No. 4,827,226 to Connell discloses a tuning network for an integrated oscillator circuit that includes a variable capacitor, i.e., a varactor, as a shunt element for providing at least one type of adjustment of the oscillating signal. More than one type of adjustment can be provided by including a bank of varactors for each of the shunt elements of the tuning network, in which various individual varactors are selected in binary fashion for setting the output frequency.

Another approach is disclosed in U.S. Pat. No. 5,030,926 to Walden, which is assigned to the current assignee of the present invention. The frequency range over which the output signal of the integrated oscillator circuit is typically adjusted is increased by the addition of a variable capacitor directly to the amplifier within the oscillator circuit. The frequency range can be further increased by selectively connecting an additional pair of variable capacitors to the oscillator circuit.

Unfortunately, selectively connecting variable capacitances within an integrated oscillator circuit has several drawbacks. One drawback is that the control circuit selecting the variable capacitors is relatively complex. Consequently, an increased surface area of the integrated oscillator circuit is necessary to support a large number of components for implementing the complex control circuit. Another drawback is an undesired charge injection condition that results during switching between capacitors if the setting is performed while the integrated oscillator circuit is operating in an electronic system.

SUMMARY OF THE INVENTION

An object of the present invention is to provide an integrated oscillator circuit and associated methods for setting an output frequency without using a complex control circuit.

This and other objects, advantages and features in accordance with the present invention are provided by an integrated circuit comprising an oscillator circuit for generating an output signal having a desired frequency, and comprising a capacitive device having a controllable capacitance value responsive to a control signal. The integrated circuit preferably includes a control circuit for controlling the capacitance value so that the oscillator circuit generates the output signal at the desired frequency.

The control circuit preferably comprises a memory for storing a digital control word, and a control signal generating circuit for converting the digital control word into the control signal for the capacitive device. The control signal generating circuit preferably comprises a pulse width modulation (PWM) circuit having a controllable duty cycle based upon the digital control word. In addition, the control circuit preferably further comprises a filter connected between the PWM circuit and the capacitive device.

Setting the frequency of the output signal to the desired frequency is advantageously performed internal to the integrated circuit via the PWM control signal. The setting may be performed after manufacture to compensate for manufacturing process variations. In addition, the setting may be done on the fly when the integrated circuit is operating in an electronic system to compensate for temperature variations, voltage dispersions and aging of the components within the oscillator circuit.

To set the frequency of the output signal to the desired frequency on the fly, the integrated circuit preferably further comprises a feedback loop between the oscillator circuit and the control circuit. The feedback loop preferably comprises a sensing circuit connected to an output of the oscillator circuit for sensing the frequency of the output signal, and a comparator circuit connected to the sensing circuit for comparing the sensed frequency to the desired frequency. The control signal generating circuit preferably further includes a counter for incrementing or decrementing a value of the digital control word based upon the sensed frequency of the output signal.

Another aspect of the present invention relates to a method for setting a desired frequency of an output signal generated by an oscillator circuit comprising a capacitive device having a controllable capacitance value responsive to a control signal. The method preferably comprises the step of converting a digital control word into the control signal for controlling the capacitance value so that the oscillator circuit generates the output signal at the desired frequency.

The method preferably further comprises the steps of sensing a frequency of the output signal, and comparing the sensed frequency of the output signal to the desired frequency. Based upon the sensed frequency of the output signal, the method preferably further includes the step of incrementing or decrementing a value of the digital control word. The above steps are preferably repeated until the sensed frequency of the output signal corresponds to the desired frequency. The digital control word producing the control signal providing the desired frequency of the output signal is preferably stored in a memory.

DETAILED DESCRIPTION OF THE DRAWINGS

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
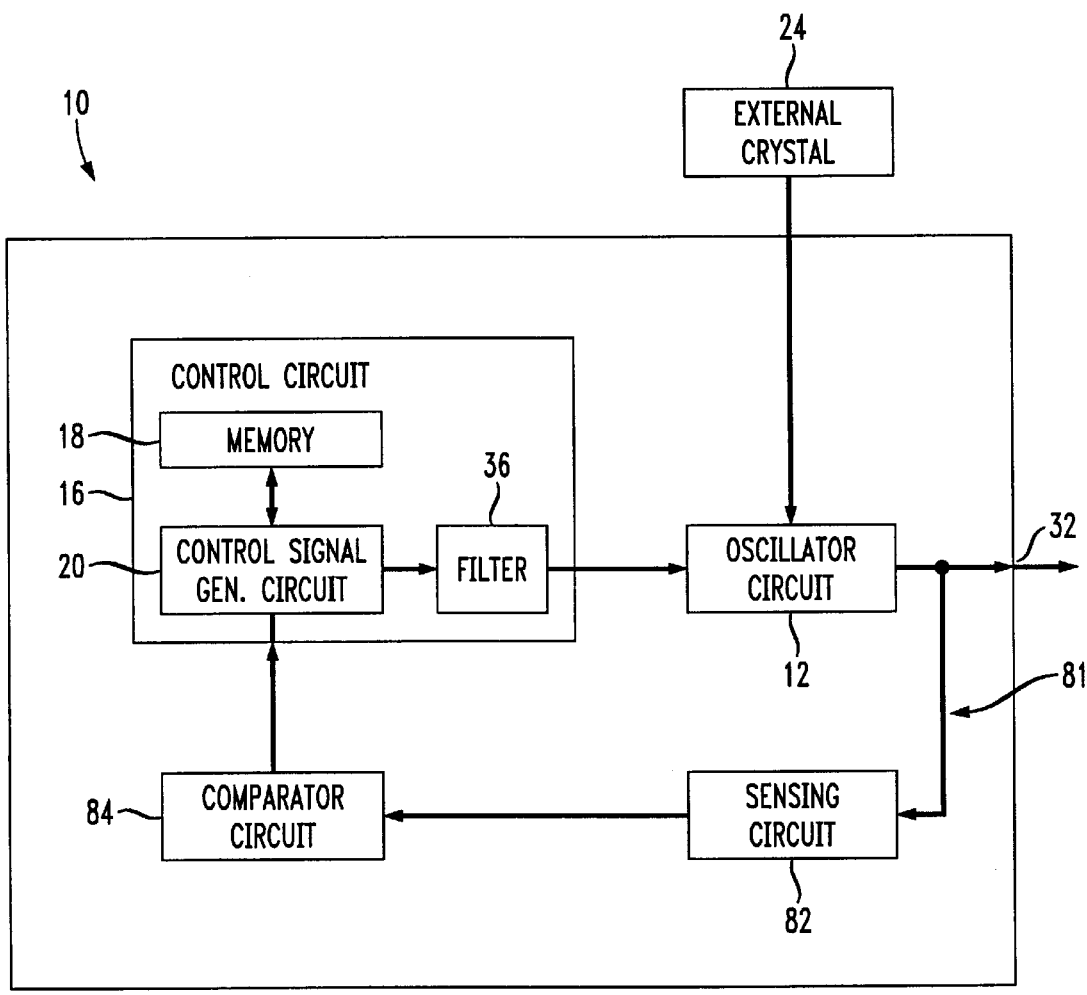
FIG. 1 is a block diagram of an integrated circuit including an oscillator circuit in accordance with the present invention.
Figure 2:
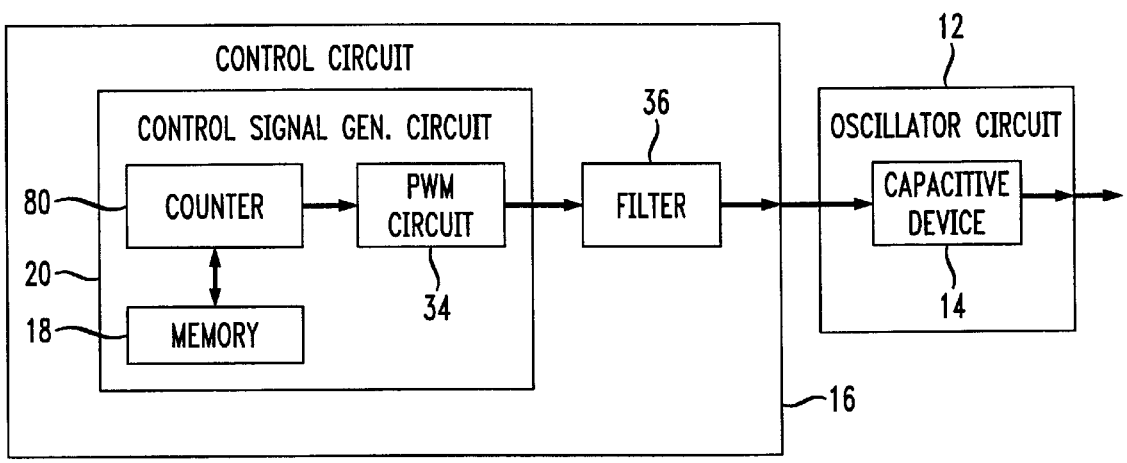
FIG. 2 is a more detailed block diagram of the oscillator circuit and the control circuit illustrated in FIG. 1.
Figure 3:
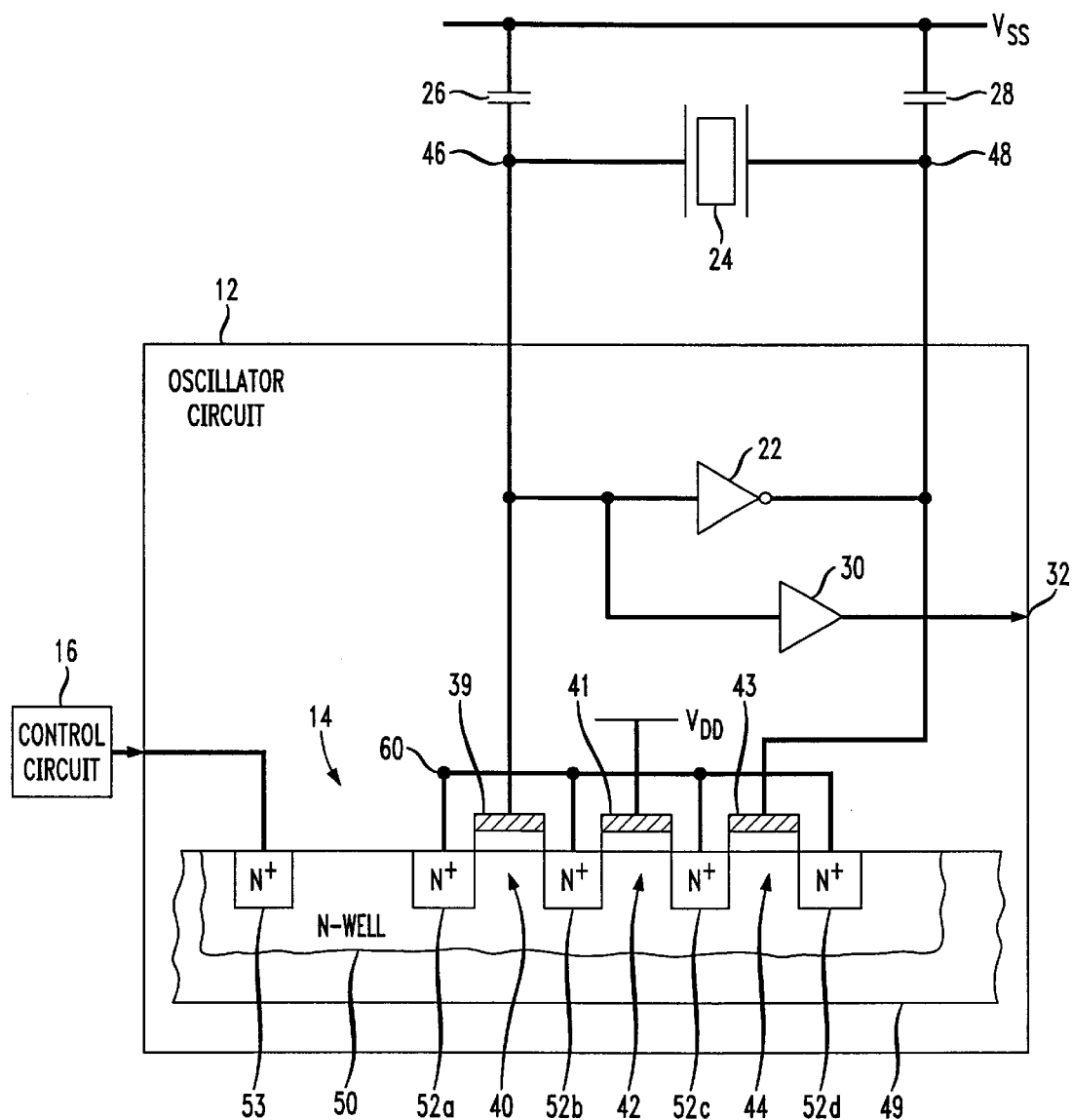
FIG. 3 is a schematic diagram of the oscillator circuit illustrated in FIG. 1.
Figure 4:
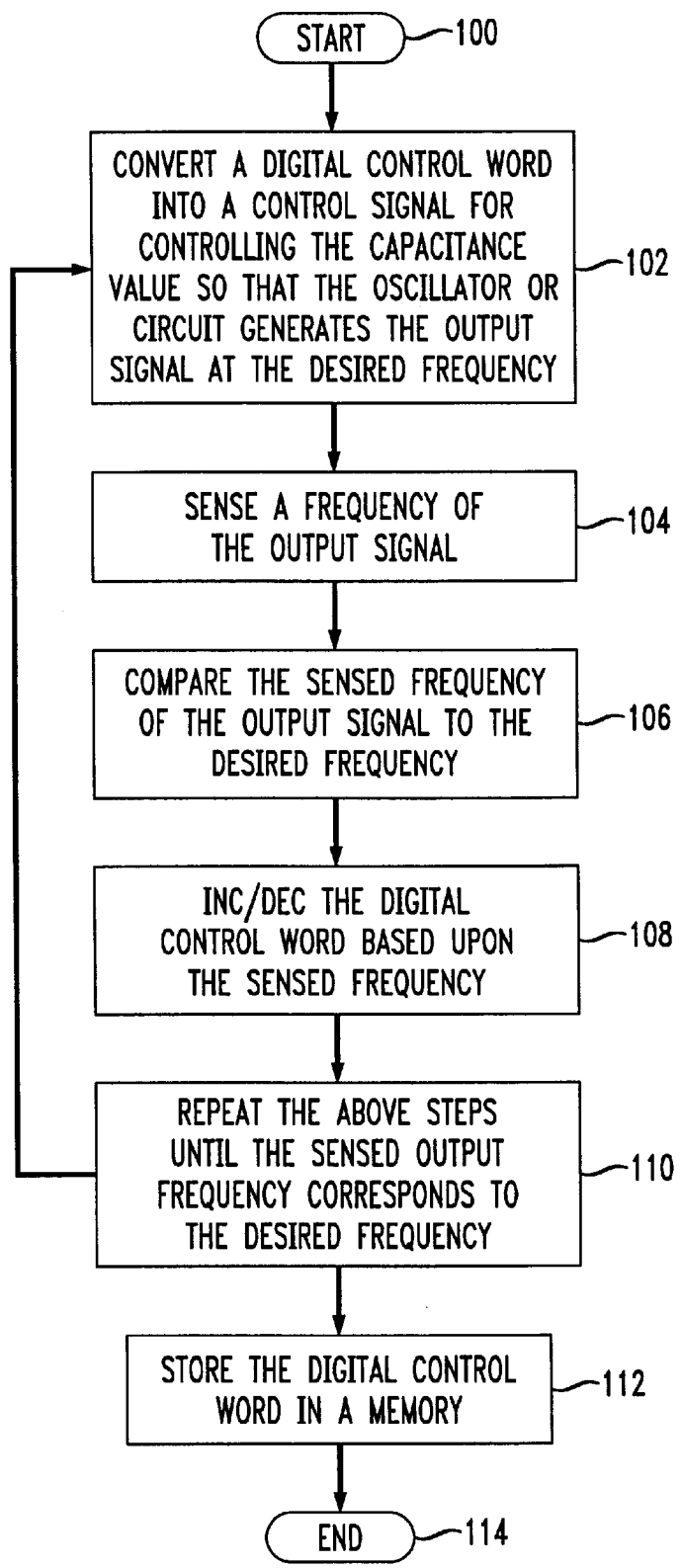
FIG. 4 is a flowchart illustrating the method for setting the desired frequency of an integrated oscillator circuit in accordance with the present invention.

Referring to FIGS. 1–3, an integrated circuit, generally indicated at 10, is described in accordance with the present invention. The integrated circuit 10 comprises an oscillator circuit 12 for generating an output signal having a desired frequency. The oscillator circuit 12 comprises a capacitive device 14 having a controllable capacitance value responsive to a control signal. A control circuit 16 is connected to the oscillator circuit 12 for controlling the capacitance value of the capacitive device 14 so that the oscillator circuit generates the output signal at the desired frequency. The control circuit 16 includes a memory 18 for storing a digital control word, and a control signal generating circuit 20 for converting the digital control word into the control signal for the capacitive device 14.

The oscillating signal is generated by an inverting amplifier 22 connected across an external crystal 24. The external crystal 24 is connected to capacitors 26 and 28, which are connected to $V_{ss}$, which may be ground. The output signal is provided by an amplifier 30 connected between the input of the inverting amplifier 22 and the output 32 of the oscillator circuit 14. Alternatively, the amplifier 30 may be connected between the output of the inverting amplifier 22 and the output 32 of the oscillator circuit 14.

The external crystal 24 is preferably an AT-cut crystal, however, other types of crystals can be used, as readily appreciated by one skilled in the art. Although depicted as a Pierce crystal oscillator in FIG. 3, other oscillator configurations are compatible with the disclosed integrated circuit 10, as readily appreciated by one skilled in the art.

An advantageous feature of the present invention is that the frequency of the output signal from the oscillator circuit 12 is set or trimmed internal to the integrated circuit 10 via the control signal. The control signal varies based upon the digital control word, which in turn varies the capacitance value of the capacitive device 14. In other words, no external components are required for setting the frequency of the output signal to the desired frequency. An exception is the use of a frequency meter (not shown) to sense the output frequency of the oscillator circuit 12 if the setting is performed just after manufacture of the integrated circuit 10.

In the illustrated embodiment, the integrated circuit 10 may be an application specific integrated circuit (ASIC) as readily appreciated by one skilled in the art. The output frequency may be 22 MHZ wherein the control circuit 16 sets the frequency of the output signal to within a tolerance of 25 parts per million (ppm), for example, to provide the desired frequency. The actual frequency of the oscillator circuit 12 is dependent upon the specific function to be performed, as readily understood by one skilled in the art. Regardless of the actual frequency, the output frequency can be set or trimmed in accordance with the present invention.

As will be described in greater detail below, the setting can be performed after manufacture so that manufacturing process variations causing frequency dispersion of the output signal can be compensated. In addition, the setting can be done on the fly while the oscillator circuit 12 is operating in an electronic system. Setting the output frequency while the electronic system is operating compensates for temperature and voltage $V_{DD}$ variations, and aging of the components.

In one approach for generating the control signal, the control signal generating circuit 20 comprises a pulse width modulation (PWM) circuit 34 having a controllable duty cycle based upon the digital control word. The control circuit 16 further comprises a filter 36 connected between the PWM circuit 34 and the capacitive device 14, as best shown in FIG. 2. In addition to the control signal being a PWM signal, other types of control signals are contemplated by the present invention for varying the capacitance value of the capacitive device 14, as readily appreciated by one skilled in the art.

The capacitive device 14 comprises a semiconductor layer 49, and a plurality of spaced apart first doped regions 52a–52d in the semiconductor layer. The plurality of spaced apart first doped regions 52a–52d are connected together to define a first electrode. The capacitive device 14 further comprises conductive gate structures 39, 41 and 43 on the semiconductor layer 49 between the adjacent first doped regions 52a–52d to define a second electrode. In addition, the capacitive device 14 further includes at least one second doped region 53 in the semiconductor layer 49 adjacent the plurality of spaced apart first doped regions 52a–52d. The control circuit 16 is connected to the second doped region 53. A first capacitor 26 is connected to a first terminal 46 of the external crystal 24, and a second capacitor 28 is connected to a second terminal 48 of the external crystal, as best shown in FIG. 3.

The capacitive device 14 is preferably formed in a well 50 of a first conductivity type in the substrate 49. If the well 50 comprises n-type dopants, then the first and second doped regions 52a–52d, 53 also comprise n-type dopants, but at a higher level of concentration, as indicated in FIG. 3. Likewise, if the well 50 comprises p-type dopants, then the first and second doped regions 52a–52d, 53 also comprise p-type dopants, but at a higher level of concentration.

A third capacitor 42 is connected between the first and second capacitors 40, 44. The third capacitor 42 is part of the filter 36 connected between the control circuit 14 and the capacitive device 16, as best shown in FIG. 2. The resistive portion of the filter 36 is provided by the inherent resistance of the well 50 between the first doped region 53 and the common node 60. The filter 36 may also be formed outside of the well 50, as readily appreciated by one skilled in the art.

Another advantageous feature of the present invention is the process step for making the three capacitors 40–44. These capacitors are formed as if metal oxide semiconductor field effect transistors (MOSFETS) were being formed. The masking and implanting steps normally performed for forming a transistor are performed in the present invention. However, the implanting steps are reduced because a channel is not needed, and the source and drain are implanted with the same type of conducting material as the well or tub of the transistors. Consequently, the process steps for making the capacitors 40–44 are simplified as readily appreciated by one skilled in the art.

As stated above, the PWM circuit 34 is a digital logic circuit using a digital control word for varying a duty cycle of the PWM control signal. By varying the duty cycle, the capacitance value of the first and second capacitors 40, 44 vary causing the output frequency of the oscillator circuit 12 to be set to the desired frequency. The digital control word for setting the duty cycle of the PWM control signal is stored in the memory 18, which may be a EEPROM, for example. In addition, the control signal generating circuit 20 further includes a counter 80 for incrementing or decrementing the digital control word when setting the frequency of the output signal to the desired frequency.

The waveform conducting through the external crystal 24 is a mixed signal that is set by the crystal, and, therefore, is relatively independent of the voltage applied to the well 50 by the control circuit 16. The mixed signal includes a DC component and a sinusoidal component. For example, a level of the DC waveform may be 1.5 volts, and a level of the AC waveform may be 0.5 volts peak, which is 1 volt peak to-peak. Regardless of the duty cycle of the PWM control signal, the voltage level of the mixed signal, i.e., the AC and DC components, will not significantly vary. However, slight variations in the voltage across the external crystal 24 are caused by varying the capacitance value of the first and second capacitors 40, 44. By varying the capacitance, this allows the frequency of the oscillating signal to be adjusted within a desired tolerance, e.g., 25 ppm.

A variable mean voltage is applied to the well 50 by varying the duty cycle of the PWM control signal. To filter out high frequencies in the PWM control signal, an RC network is required, as indicated by filter 36. This ensures that the PWM control signal is a DC waveform, which includes some residual noise. The maximum residual noise produced can be calculated by the following formula: $e_{max} = [V_{DD}*2^{n-2}]/[R*C*f]$. N is the number of bits of the digital control word, and f is the clock frequency of the control circuit 16.

The time constant for the RC network meets the following formula: $R*C=2^{2(n)-1}/f$.

The resistance and capacitance of the filter 32 can be implemented in many ways within the integrated circuit 10. As discussed above, the resistance may be provided by the inherently high resistance of the well 50, which may typically be within a range of about 5 to 10 Mohm between the second doped region 53 and the common node 60. The capacitance is provided by the third capacitor 42 on the substrate 49 between the first and second capacitors 40, 44.

Another approach to forming the filter 32 is to use a resistor and a capacitor external to the well 50.

As stated above, the frequency of the output signal generated by the oscillator circuit 14 can be set or trimmed just after manufacture or on the fly. If the setting is done after manufacture, a digital control word is loaded into the digital logic counter 80 and the output frequency is sensed. The sensing may be done with equipment external to the integrated circuit 10. Based upon the sensed frequency of the output signal, the digital control word in the digital logic counter 80 is incremented or decremented until the sensed output frequency equals the desired frequency. When the desired frequency is sensed, the corresponding digital control word is stored in the memory 18. The stored digital control word thus allows manufacturing process variations to be compensated.

To set the output frequency of the oscillator circuit 12 when the integrated circuit 10 is operating in an electronic system, i.e., on the fly, a feedback loop 81 is implemented between the oscillator circuit 12 and the control circuit 16. The feedback loop 81 includes a sensing circuit 82 connected to the output 32 of the oscillator circuit 12 for sensing the frequency of the output signal. A comparator circuit 84 connected to the sensing circuit 82 compares the sensed frequency of the output frequency to the desired frequency. Based upon the comparison, the digital control word is incremented or decremented until the sensed output frequency equals the desired frequency. When set within the desired tolerance, the corresponding digital control word is stored in the memory 18. Consequently, frequency dispersion due to temperature and voltage variations, and ageing of the components within the oscillator circuit 12 can be compensated.

Another aspect of the present invention is a method for setting a desired frequency of an output signal generated by an oscillator circuit 12 comprising a capacitive device 14 having a controllable capacitance value responsive to a control signal. From the start (Block 100), the method comprises the step of converting a digital control word into the control signal for controlling the capacitance value so that the oscillator circuit 12 generates the output signal at the desired frequency.

The method further comprises the steps of sensing a frequency of the output signal at Block 104, and comparing the sensed frequency of the output signal to the desired frequency at Block 106. Based upon the sensed frequency of the output signal, the method further includes the step of incrementing or decrementing a value of the digital control word at Block 108. The above steps are repeated until the sensed frequency of the output signal corresponds to the desired frequency (Block 110). The digital control word producing the control signal providing the desired frequency of the output signal is stored in a memory 76 at Block 112, and the setting is stopped at Block 114.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An integrated circuit comprising:
    an oscillator circuit for generating an output signal having a desired frequency and comprising a capacitive device having a controllable capacitance value responsive to a pulse width modulation (PWM) control signal; and a control circuit for controlling the capacitance value of said capacitive device so that said oscillator circuit generates the output signal at the desired frequency, said control circuit comprising a memory for storing a digital control word and a control signal generating circuit for converting the digital control word into the PWM control signal for said capacitive device.

2. An integrated circuit according to claim 1 wherein said control signal generating circuit comprises a PWM circuit having a controllable duty cycle based upon the digital control word.

3. An integrated circuit according to claim 2 wherein said control signal generating circuit further comprises a filter connected between said PWM circuit and said capacitive device.

4. An integrated circuit according to claim 1 wherein said capacitive device comprises:

a semiconductor layer;

a plurality of spaced apart first doped regions in said semiconductor layer, said plurality of spaced apart first doped regions connected together defining a first electrode.

5. An integrated circuit according to claim 4 further comprising at least one conductive gate structure on said semiconductor layer between adjacent first doped regions defining a second electrode.

6. An integrated circuit according to claim 4 further comprising at least one second doped region in said semiconductor layer adjacent said plurality of spaced apart first doped regions; and wherein said control circuit is connected to said at least one second doped region.

7. An integrated circuit according to claim 1 further comprising a feedback loop between said oscillator circuit and said control circuit.

8. An integrated circuit according to claim 7 wherein said feedback loop comprises:

a sensing circuit connected to an output of said oscillator circuit for sensing a frequency of the output signal; and a comparator circuit connected to said sensing circuit for comparing the sensed frequency of the output signal to the desired frequency.

9. An integrated circuit according to claim 8 wherein said control circuit further comprises a counter for incrementing or decrementing a value of the digital control word based upon the sensed frequency of the output signal.

10. An integrated circuit comprising:

a semiconductor layer;

an oscillator circuit in said semiconductor layer for generating an output signal having a desired frequency and comprising a capacitive device having a controllable capacitance value responsive to a pulse width modulation (PWM) control signal; and a control circuit for controlling the capacitance value of said capacitive device so that said oscillator circuit generates the output signal at the desired frequency, said control circuit comprising a memory for storing a digital control word and a control signal generating circuit for converting the digital control word into the PWM control signal for said capacitive device.

11. An integrated circuit according to claim 10 wherein said control signal generating circuit comprises a PWM circuit having a controllable duty cycle based upon the digital control word.

12. An integrated circuit according to claim 11 wherein said control signal generating circuit further comprises a filter connected between said PWM circuit and said capacitive device.

13. An integrated circuit according to claim 10 wherein said capacitive device comprises:

a plurality of spaced apart first doped regions in said semiconductor layer, said plurality of spaced apart first doped regions connected together defining a first electrode; and at least one conductive gate structure on said semiconductor layer between adjacent first doped regions defining a second electrode.

14. An integrated circuit according to claim 13 further comprising at least one second doped region in said semiconductor layer adjacent said plurality of spaced apart first doped regions; and wherein said control circuit is connected to said at least one second doped region.

15. An integrated circuit according to claim 10 further comprising a feedback loop between said oscillator circuit and said control circuit.

16. An integrated circuit according to claim 15 wherein said feedback loop comprises:

a sensing circuit connected to an output of said oscillator circuit for sensing a frequency of the output signal; and a comparator circuit connected to said sensing circuit for comparing the sensed frequency of the output signal to the desired frequency.

17. An integrated circuit according to claim 16 wherein said control circuit further comprises a counter for incrementing or decrementing a value of the digital control word based upon the sensed frequency of the output signal.

18. A method for setting a desired frequency of an output signal generated by an oscillator circuit comprising a capacitive device having a controllable capacitance value responsive to a pulse width modulated (PWM) control signal, the method comprising the step of:

converting a digital control word into the PWM control signal for controlling the capacitance value so that the oscillator circuit generates the output signal at the desired frequency.

19. A method according to claim 18 further comprising the step of varying a duty cycle of the PWM control signal based upon the digital control word.

20. A method according to claim 19 further comprising the step of filtering the PWM control signal.

21. A method according to claim 18 further comprising the step of storing the digital control word in a memory.

22. A method according to claim 18 further comprising the steps of:

sensing a frequency of the output signal; and comparing the sensed frequency of the output signal to the desired frequency.

23. A method according to claim 22 further comprising the step of incrementing or decrementing the digital control word based upon the sensed frequency of the output signal.

* * * * *